US005664320A

United States Patent [19]

Gurevich

[11] Patent Number: 5,664,320

[45] Date of Patent: Sep. 9, 1997

[54] METHOD OF MAKING A CIRCUIT PROTECTOR

[75] Inventor: Leon Gurevich, Grover, Mo.

[73] Assignee: Cooper Industries, Houston, Tex.

[21] Appl. No.: 408,843

[22] Filed: Mar. 23, 1995

Related U.S. Application Data

[62] Division of Ser. No. 227,399, Apr. 13, 1994.

[51] Int. Cl.[6] .............................. H01H 69/02; H05K 5/06

[52] U.S. Cl. .............................. 29/623; 29/619; 29/844; 29/855; 65/59.6; 65/110

[58] Field of Search .............................. 29/623, 619, 842, 29/843, 844, 855, 856; 65/59.6, 108, 110; 337/228, 246, 297

[56] References Cited

U.S. PATENT DOCUMENTS

| | | | |
|---|---|---|---|
| 2,244,548 | 6/1941 | Benkleman | 29/619 |
| 3,205,562 | 9/1965 | Karalis et al. | 29/619 |
| 3,810,068 | 5/1974 | DeLuca | 29/619 |
| 4,016,527 | 4/1977 | Francis et al. | 29/619 |
| 4,729,852 | 3/1988 | Hata | 338/22 R |

*Primary Examiner*—P. W. Echols
*Attorney, Agent, or Firm*—Doane, Swecker & Mathis, L.L.P.

[57] ABSTRACT

A subminiature circuit protector includes a substrate carrying a metal fuse element hermetically sealed in a glass sleeve cartridge. The fuse element may comprise a film deposited on the substrate, or, alternatively a metal strip or wire. Leads extend from opposing ends of the sleeve for connection in a circuit, and a gas is sealed in the sleeve to provide a suitable environment to improve operating lifetime and interrupting capability. A method for making a circuit protector includes placing a substrate carrying a fuse element in a glass sleeve and placing leads in contact with the fuse element. The assembly is heated in the presence of a gas below atmospheric pressure to a temperature sufficient to soften the glass. The pressure is then increased to cause the ends of the glass sleeve to form a hermetic seal about the leads.

12 Claims, 3 Drawing Sheets

METHOD OF MAKING A CIRCUIT PROTECTOR

This application is a divisional of application Ser. No. 08/227,399, filed Apr. 13, 1994.

FIELD OF THE INVENTION

The present invention relates to a method for making a circuit protector and a circuit protector made by the method of the invention. More particularly, the present invention relates to a method for making a cartridge type subminiature circuit protector that is inexpensive and simple to perform, and a circuit protector having enhanced operating lifetime and improved current interrupting capability.

BACKGROUND AND SUMMARY OF THE INVENTION

Subminiature circuit protectors are useful in applications in which size and space limitations are important, for example, on circuit boards for electronic equipment. Cartridge type circuit protectors, basically comprising fuse elements in glass sleeves, are known to be reliable, particularly when the fuse element is hermetically sealed in the glass sleeve. Making hermetically sealed subminiature glass sleeve circuit protectors in the reduced size required for computer circuit boards, however, is labor intensive and relatively expensive. This typically involves mechanically attaching lead wires or connectors to the fuse element, and using a heat cured epoxy resin to form the hermetic seal. In addition, these manufacturing difficulties impose limitations on how small the circuit protectors can be made.

The present invention, generally, provides a simple and relatively inexpensive method of manufacturing a subminiature cartridge type circuit protector.

The present invention also provides a subminiature circuit protector made by the method of the invention that has an improved operating lifetime and improved interrupting capability.

More particularly, the present invention provides a method for making a subminiature glass cartridge circuit protector having a substrate carrying a metal film fuse element connected to leads, the metal film fuse element and portions of the lead elements being hermetically sealed in a glass sleeve.

According to another aspect of the invention, a gas is trapped in the glass cartridge to provide a non-oxidizing environment for improving the operating lifetime of the fuse element. A gas with arc quenching properties may be selected to improve the current interrupting capability of the circuit protector.

Alternatively, the environment in the glass sleeve may be air, or air at a pressure less than atmospheric pressure.

According to the method of the present invention, a substrate having a metal film fuse element is placed in a glass sleeve, and leads and solder preforms are placed in contact with the contacts of the fuse element. The assembly is placed in an environmentally controllable chamber, which is at least partially evacuated. The chamber then may be charged with a selected gas. The assembly is heated to a temperature sufficient to soften the glass and melt the solder, and the pressure in the chamber is increased so that the ends of the glass sleeve deform about the leads and form a hermetic seal. Heating causes the solder to melt and form a connection between the leads and the contacts of the fuse element substrate.

The environment in the assembly may be air. The pressure in the chamber may be decreased to a pressure below atmospheric pressure to provide a partial vacuum environment. Alternatively, the pressure may be increased to substantially atmospheric pressure.

According to another embodiment of the invention, a selected gas is introduced into the chamber after evacuation. In one embodiment, the selected gas is an inert gas, such as nitrogen. When the seals form, the gas is captured in the sleeve, and provides an environment that prolongs the operating lifetime of the fuse element.

According to an alternative embodiment, the selected gas is sulfur hexafluoride. Sulfur hexafluoride enhances the interrupting capability of the fuse element.

BRIEF DESCRIPTION OF THE DRAWING FIGURES

Preferred embodiments of the present invention are illustrated in the appended drawings, wherein like elements are provided with the same reference numerals. In the drawings.

Figure 5A:
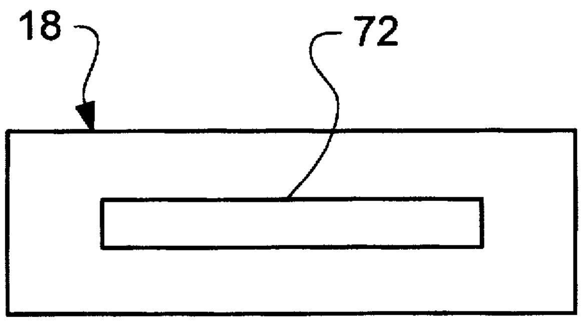
Figure 5B:
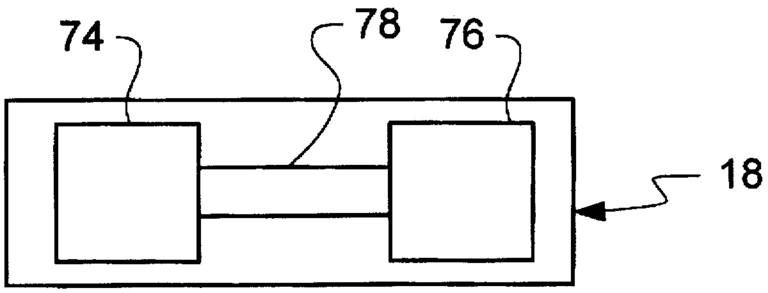

FIG. 5*a* is a schematic view of a first step in an illustrative manufacturing process for making a printed ceramic fuse element of the circuit protector of the present invention;

FIG. 5*b* is a second step of the process of FIG. 5*a;*

Figure 5C:
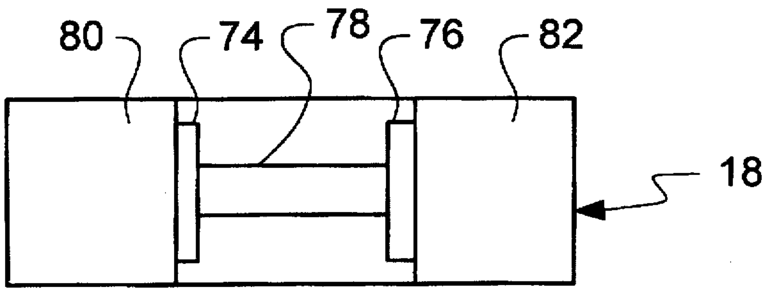
Figure 5D:
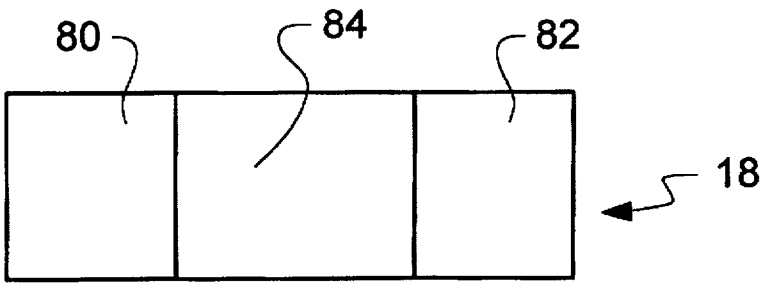

FIG. 5*c* is a third step of the process of FIG. 5*a;* and,

FIG. 5*d* is a fourth step of the process of FIG. 5*a.*

DETAILED DESCRIPTION OF PREFERRED EMBODIMENTS

Figure 1:
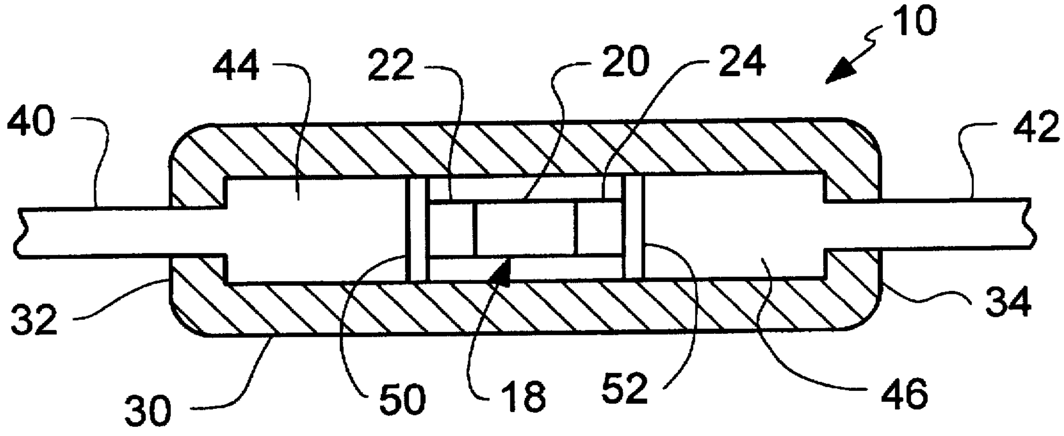
FIG. 1 is a cross-sectional view of a circuit protector in accordance with the present invention.

Referring to FIG. 1, a circuit protector 10 in accordance with this invention comprises a fuse element 20 carried on a substrate 18 and hermetically sealed in a cartridge-type glass sleeve 30. In a preferred embodiment of the invention, the fuse element 20 is a metal film deposited on the substrate 18 and having electrical contact pads 22, 24 at opposing ends. A fusible portion 72 (shown in FIG. 5) connects the opposing contact pads. The geometry of the fusible portion 72 may be selected to meet the particular interrupting requirements for the circuit protector, as is known in the art. An illustrative method of preparing a fuse element 20 that may be used in conjunction with the invention is described below in connection with FIG. 5.

Leads 40, 42 are connected at each of the contact pads 22, 24 to make an electrically conductive path. The leads 40, 42 comprise electrically conductive wires or similar components. The leads 40, 42 illustrated in FIG. 1 are shaped to have head portions 44, 46 larger than the body of the leads. As illustrated in FIG. 1, the glass sleeve 30 encloses the fuse element bearing substrate 18 and the head portions 44, 46 in the sleeve. The sleeve ends 32, 34 form hermetic seals around the lead elements 40, 42.

Solder preforms 50, 52 at the end of the head portions 44, 46 facilitate forming an electrical connection between the lead elements 40, 42 and the contact pads 22, 24 of the fuse element 20. The preforms 50, 52 are comprised of solder, and can be easily applied in a predetermined amount by a suitable method.

Figure 3:
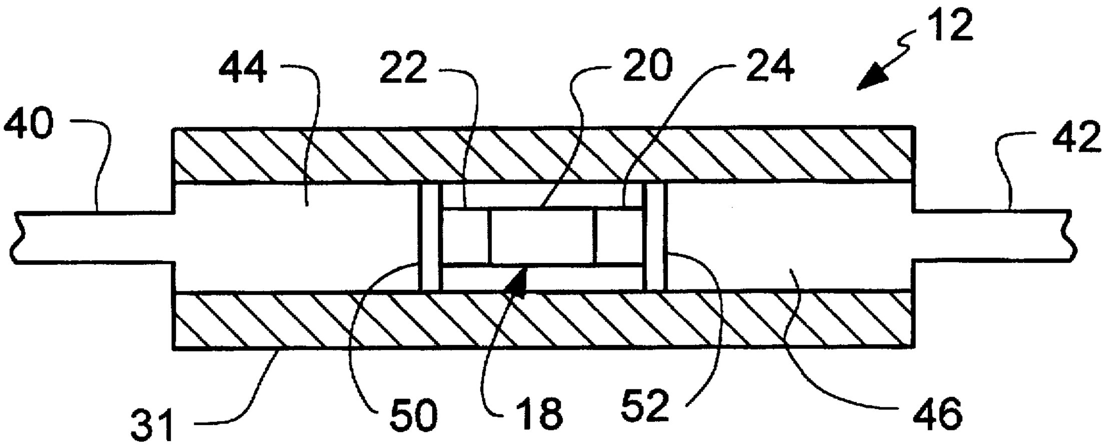
FIG. 3 is a cross-sectional view of a circuit protector in which an alternative form of the glass sleeve is used.
Figure 4:
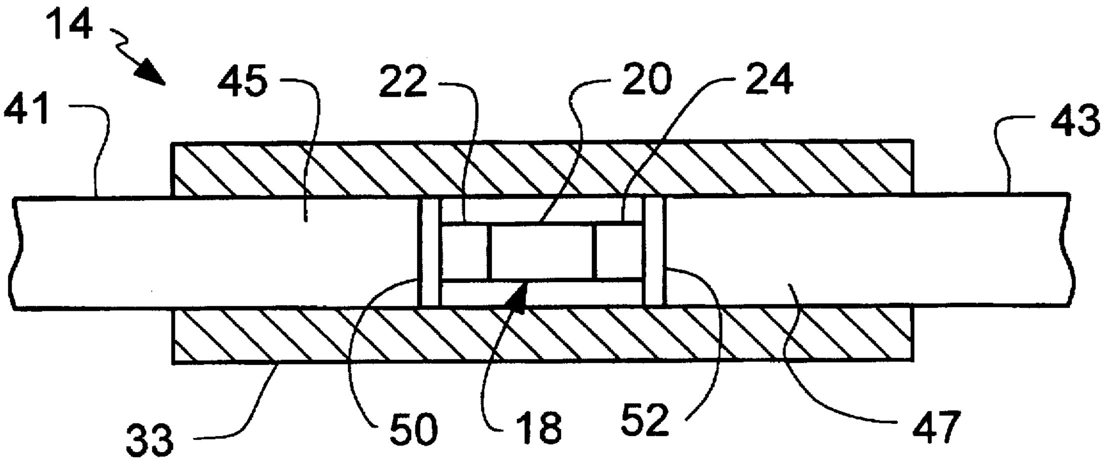
FIG. 4 is a cross-sectional view of a circuit protector in which alternative forms of a glass sleeve and leads are used.

FIG. 3 and FIG. 4 illustrate alternative embodiments of the circuit protector of FIG. 1. In FIG. 3, a glass sleeve 31 extends only over the head portions 44, 46, but does not entirely enclose them. As in FIG. 1, the head portions 44, 46 are formed to be larger than the leads 40, 42, and the glass sleeve 31 forms a seal around the head portions 44, 46 of the leads 40, 42. In FIG. 4, a glass tube 33 also extends over head portions 45, 47. In this embodiment, the leads 41, 43 and the head portions 45, 47 have substantially the same diameter. The glass sleeve 33 forms a seal around the head portions 45, 47 of the leads 41, 43.

Referring again to FIG. 1, surrounding the fuse element 20 and substrate 18 in the glass sleeve 30 is a selected gas that is trapped in the sleeve during manufacturing of the circuit protector 10 to provide a suitable environment for the fuse element. The circuit protectors of FIG. 3 and FIG. 4 are also provided with a select environment as described here. The method for making a circuit protector of the invention is further described below.

In one embodiment of the invention, the selected gas is an inert gas, such as nitrogen or argon. The inert gas prolongs the operating lifetime of the circuit protector by providing an inert, non-oxidizing environment. In a preferred embodiment of the invention, the selected gas is one having arc quenching properties, such as sulfur hexafluoride, which improves the interrupting capability of the circuit protector.

Alternatively, the environment may be composed of air. The environment may also be one of a selected gas at a pressure below atmospheric pressure to provide a partial vacuum environment.

Figure 2:
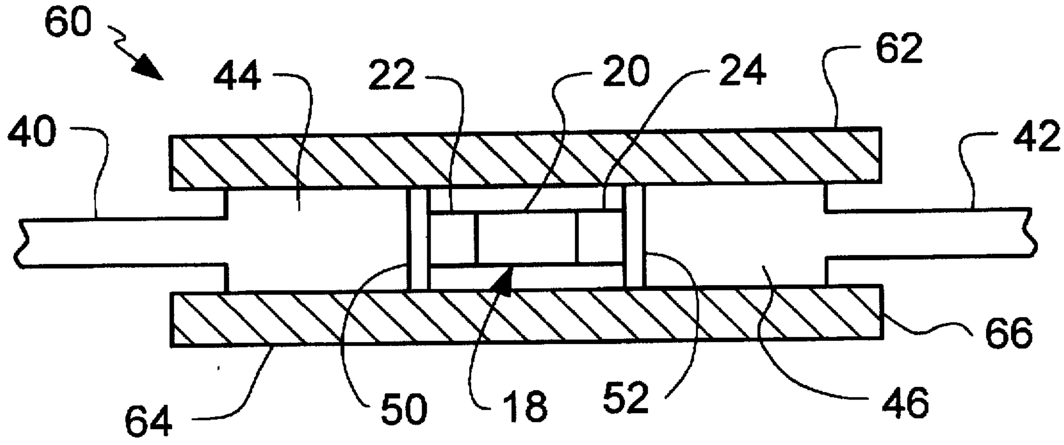
FIG. 2 is a cross-sectional view of an assembly of elements for making the circuit protector of FIG. 1.

Referring now to FIG. 2, a method for making the circuit protector of FIG. 1 is described. FIG. 2 is a part sectional view of an assembly 60 of the elements that make the circuit protector. The elements in FIG. 2 are the same as those described in connection with FIG. 1. The circuit protectors of FIG. 3 and FIG. 4 are formed in substantially the same manner as described, except as mentioned.

According to the method of the invention, a substrate 18 carrying a metallic film fuse element 20 is placed in a glass sleeve 62. The fuse element 20 is electrically connected to conductive contacts 22, 24 at opposing ends of the element.

Leads 40 and 42 are provided with head portions 44 and 46 suitable for forming electrical connections with the contacts on the end of the substrate 20. The head portions 44, 46 may be enlarged as shown in FIG. 1 and FIG. 3, or the head portions 45, 47 may be substantially the same diameter as the body of the leads, as shown in FIG. 4. Solder preforms 50, 52 are placed on the end of each of the head portions 44, 46. The head portions 44, 46 are placed in contact with the contacts 22, 24 of the fuse element 20 so that an electrical pathway is formed through the fuse element. The glass sleeve 30, the substrate 18 carrying the fuse element 20 and the leads 40, 42 form an assembly 60.

The assembly 60 is next placed in a pressure and temperature controllable chamber. The chamber is used to introduce a selected environment for the fuse, and to form seals between the glass sleeve 30 and the leads 40, 42. If the environment for the fuse element is other than air, the chamber is substantially completely evacuated. If air is selected for the environment, the chamber is at least partially evacuated.

In the case of a gas other than air being used in the environment, after evacuation, a selected gas is introduced into the chamber at a predetermined pressure below atmospheric pressure. As explained above, the gas is selected for a particular function: an inert gas, such as nitrogen, may be added to improve the operating lifetime; or, a gas having arc quenching properties, such as sulfur hexafluoride, may be selected for improved interrupting capability.

The temperature of the chamber is next gradually increased over a predetermined time to a temperature sufficient to heat and soften the glass. Depending on the type of glass used, the temperature sufficient for this purpose is in a range of about 500° to 800° C. At this temperature, the glass softens and adheres to the leads and the solder preforms 50, 52 melt and form an electrical connection with the contact pads 22, 24.

Once the assembly 60 has reached the predetermined temperature, additional gas is introduced into the chamber to raise the pressure so that the ends 64, 66 of the glass sleeve 62 to form a hermetic seal around the leads 40, 42. Raising the pressure to a pressure within a range of 0.001 to 1 atmospheres is sufficient to cause the glass to form the desired seal.

When the seal is formed around the head portions of the leads, a portion of the gas is thus trapped in the glass sleeve to become the selected environment for the fuse element 20. After the seal is formed, the gas in the chamber is removed and atmospheric air returned, and the temperature of the chamber is returned to ambient temperature.

The method of the present invention permits the manufacture of smaller cartridge-type circuit protectors than have been known, on the order of 0.050 inches in diameter and 0.250 inches in length. The method also provides for the rapid processing of a multiplicity of circuit protector assemblies as a single batch. The method eliminates many of the disadvantages of the art, including mechanical attaching steps, mechanical sealing elements, and the long heat cure of epoxy resin typically used in manufacture. The method reduces labor and processing time, and thus, reduces the cost of producing these units.

FIG. 5 shows an illustrative method for making one type of fuse element that may be assembled in the circuit protector 10 of the present invention, although other types of fuse elements are also contemplated. The method is described for making a single deposited fuse element, however, the description is meant to be illustrative rather than limitative. The method can be applied to a multiplicity of green or fired ceramic substrates arranged in a sheet form, that may be separated into individual units after processing.

Beginning with FIG. 5*a*, a weak spot 72, or fusible portion, is deposited on a substrate 18. The weak spot 72 comprises a conductive material selected and formed so that it will melt and cease to conduct if exposed to a sufficient electrical current.

As illustrated in FIG. 5*b*, a first conductive pad 74, 76 is deposited over opposing end portions of the weak spot 72, leaving a central portion 78 of the weak spot exposed. The conductive pads 74, 76 may be formed of gold, silver, or another suitable material.

Shown in FIG. 5*c*, a second conductive pad 80, 82 is printed over the first conductive pads 74, 76. In a preferred embodiment of the invention, the second conductive pads 80, 82 are silver, or a silver alloy.

As illustrated in FIG. 5*d*, a glass cover 84 is printed over the exposed portion 78 of the weak spot and the first conductive pads 74, 76, leaving the second conductive pads 80, 82 at least partially exposed. The element shown in FIG. 5*d* is the fuse element 20 used in the assemblies of FIG. 1 and FIG. 2.

The foregoing has described the preferred principles, embodiments and modes of operation of the present invention; however, the invention should not be construed as limited to the particular embodiments discussed. Instead, the above-described embodiments should be regarded as illustrative rather than restrictive, and it should be appreciated that variations, changes and equivalents may be made by others without departing from the scope of the present invention as defined by the following claims.

What is claimed is:

1. A method for making a circuit protector, comprising the steps of:

inserting a substrate carrying a fuse element and having electrical contacts at opposing end portions in a glass sleeve, the glass sleeve having open ends;

positioning one lead at each end portion of the substrate in contact with the electrical contacts;

placing the assembly in a pressure and temperature controllable chamber;

at least partially evacuating the chamber;

heating the chamber to heat the assembly to a temperature sufficient to soften the glass sleeve so that the ends of the glass sleeve adhere to the leads; and, increasing the pressure to a pressure sufficient to cause the ends of the softened glass sleeve to form a hermetic seal around the leads.

2. The method as claimed in claim 1, further comprising:

lowering the temperature to ambient temperature after the seal is formed around the lead elements.

3. The method as claimed in claim 1, wherein the chamber is substantially evacuated, and further comprising the step of introducing a selected gas into the chamber at a predetermined pressure below atmospheric pressure.

4. The method as claimed in claim 3, wherein the pressure is increased by introducing additional selected gas into the chamber.

5. The method as claimed in claim 3, wherein the selected gas is an inert gas.

6. The method as claimed in claim 5, wherein the selected gas is nitrogen.

7. The method as claimed in claim 3, wherein the selected gas is sulfur hexafluoride.

8. The method as claimed in claim 1, wherein the pressure is increased by introducing air into the chamber.

9. The method as claimed in claim 1, wherein the pressure of the heated chamber is increased to a pressure below atmospheric pressure.

10. The method as claimed in claim 1, wherein the pressure of the heated chamber is increased to substantially atmospheric pressure.

11. The method as claimed in claim 1, further comprising applying a solder preform to a head portion of each lead.

12. The method as claimed in claim 11, wherein the step of heating the assembly melts the solder preform on the head portion sufficiently to cause it to form a connection with the contact of the fuse element.

* * * * *